United States Patent [19]

Curti

[11] 4,040,352
[45] Aug. 9, 1977

[54] ADJUSTABLE WORK TABLE FOR SILK SCREEN PRINTER

[76] Inventor: Ezio Curti, Viale Regina Giovanna 38, Milan, Italy

[21] Appl. No.: 653,615

[22] Filed: Jan. 30, 1976

[51] Int. Cl.² .................. B41F 15/26; B41F 17/00
[52] U.S. Cl. .................. 101/407 BP; 101/126; 118/502
[58] Field of Search ....... 101/123, 124, 126, DIG. 12, 101/407 R, 407 BP, 415, 35, 41, 44, 382 R, 383–390; 269/50, 52, 54.4, 54.5, 77, 57; 271/232, 238; 33/184.5, 184.6; 279/1 R, 1 A, 1 J, 1 ME; 118/500, 502, 503

[56] References Cited

U.S. PATENT DOCUMENTS

| 1,022,879 | 4/1912 | Schley | 101/383 |
| 2,011,584 | 8/1935 | Lengel et al. | 33/184.5 |
| 2,921,796 | 1/1960 | Ernest | 279/1 J |
| 3,336,902 | 8/1967 | Upton et al. | 118/503 |
| 3,416,440 | 12/1968 | Miller et al. | 101/35 |

Primary Examiner—Edgar S. Burr
Assistant Examiner—R. E. Suter
Attorney, Agent, or Firm—Ralph W. Kalish

[57] ABSTRACT

A printing table with adjustably positionable, work-engageable reference pins which comprises discs rotatably mounted on the table with the top surfaces of said table and discs being coplanar; each disc having a groove within which a reference pin-carrying block is slideably disposed; and with there being latching components for respectively locking the discs and the related blocks in relative selected position. The table may also be provided with grooves and cooperating reference pin-carrying blocks.

8 Claims, 2 Drawing Figures

ADJUSTABLE WORK TABLE FOR SILK SCREEN PRINTER

BACKGROUND AND SUMMARY OF THE INVENTION

This invention relates in general to silk-screen printing machines and, more particularly to a printing table therefor having adjustably positionable work-engageable reference pins.

As is well known, many articles of work, such as rigid plates which, for example, include supports for printed circuits, must be properly positioned and fixed to the printing tables of silk-screen printing machines for maintenance against undesired shifting during the printing process. A widely utilized expedient for such purpose comprehends the provision of holes through the bottom of the work for accepting pins or dowels projecting upwardly from the printing table. Heretofore, the customary embodiment of such expedient has been the provision of a groove in the front side of the printing table for receiving a plurality of blocks slideable therein with each carrying a pin. By using suitable clamping means, such blocks can be maintained in a selected position which is dictated by the arrangement of the reference holes provided in the work. It will be seen that since the blocks are incapable of disposition except in a fixed linear path, the location of the reference holes in the work is dictated by the limited adjustability range of the blocks. Thus, such system of positioning is undesirably restricted. Furthermore, as it is preferable to effect the printing operation in a direction longitudinally of the work, with any slight play between the reference holes and coordinating pins, there will be certain oscillations or shifting of the work, particularly when the work constitutes relatively long plates whereby such oscillations prevent the high degree of accuracy required. Accordingly heretofore in order to avoid such obvious drawbacks, lengthy work plates were printed in a transverse or crosswise manner with attendant difficulties and resultant printing imperfections, all being well known to those skilled in the art.

Therefore, it is an object of the present invention to provide a table adapted for adjustable positioning of work-engaging reference pins in a multitude of directions within the plane of the printing table whereby the related holes in the work may be located at the most suitable points thereon.

It is another object of the present invention to provide a printing table of the character stated which incorporates rotatable elements on the table having a radially extending groove within which a reference pin-carrying block is slideably disposed so that the latter may be located within an infinitude of positions.

It is another object of the present invention to provide a printing table of the character stated which also embodies grooves for slideably disposed reference pin-carrying blocks so that the pins of the latter may cooperate with the pins carried upon the discs to effect reliable engagement with the work at mutually spaced points for maintaining the work in a rigid state during the printing operation.

It is a still further object of the present invention to provide a printing table of the type stated which may be most economically manufactured; which may be easily operated; which is markedly versatile for accommodating a multiplicity of hole arrangements in the work; the use of which assures of requisite disposition of the work for high fidelity in the printing procedure; and which is extremely durable in usage.

DESCRIPTION OF THE PREFERRED EMBODIMENT

Figure 1:
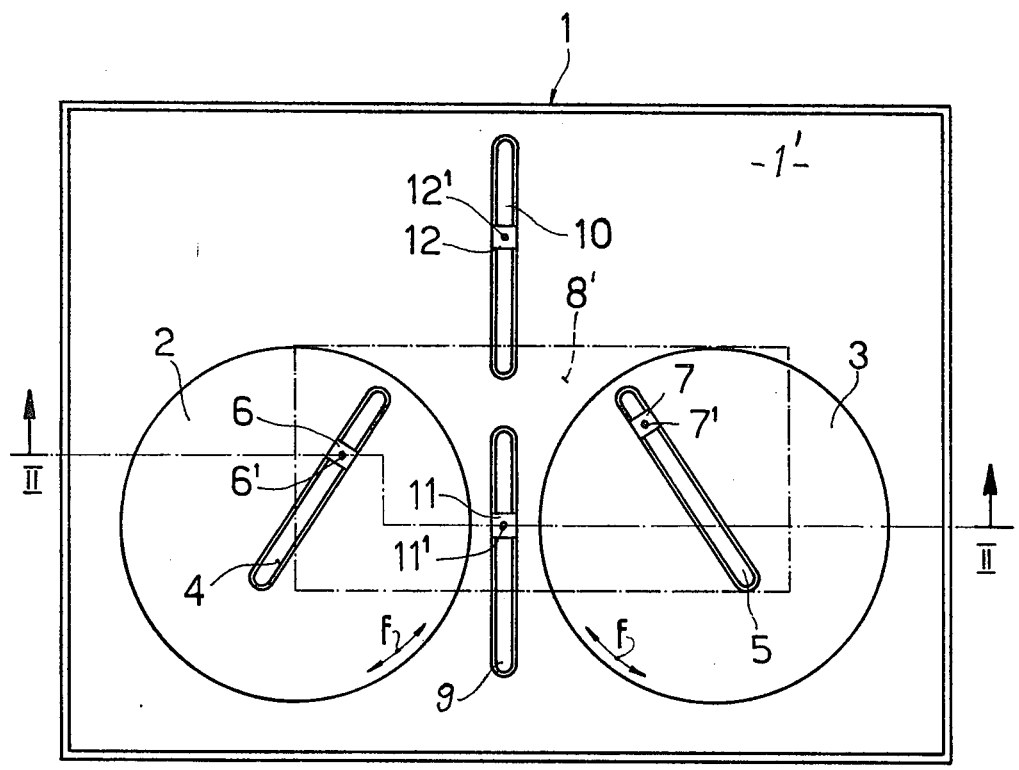
FIG. 1 is a top plan view of a printing table of a silk-screen printing machine which table is constructed in accordance with and embodies the present invention.

Referring now by reference characters to the drawings which illustrate the preferred embodiment of the present invention, 1 designates the printing table, as of a silk-screen printing machine. Disposed within juxtaposed openings in table 1 are discs 2,3 which are rotatable about vertical axes passing therethrough and with the top surfaces of said discs 2,3 being coplanar with the top surface 1' of printing table 1. Provided within each disc 2,3 is a radially extending groove 4,5 which has a length, preferably, slightly greater than the radius upon which each disc 2,3 is formed. Slideably provided within each groove, 4,5 is a block 6,7, respectively, which latter carry reference pins or dowels 6',7', respectively which project upwardly beyond the upper surface of the associated disc 2,3, respectively, for reception within reference holes 8 in the work, such as, plate 8', to be printed. Said holes 8 may be drilled or otherwise provided in work 8' without concern as to the disposition of pins 6', 7' and thus may be presented at the most desirable locations on said work 8' without the necessity of being presented in the edge portion thereof as has been requisite with work plates to the present time.

If desired, table 1 may be provided with grooves, such as at 9,10, which are fundamentally of like character as grooves 4,5 and which slideably support blocks 11,12, respectively, which carry supplementary or auxiliary reference pins 11', 12', respectively. The provision of such additional pins 11', 12' is not absolutely vital to the effective engagement of the work 8', but the same do enhance the interengagement with the work plate 8' and thereby promote increased securement in printing position. Said grooves 9,10 are shown as in coaxial relationship with the former being interposed between discs 2,3. However, it is to be understood that said grooves 9,10 may be located in other than the specific disposition illustrated without departing from the spirit of the invention as the same, as stated, serve to increase the points of engagement with the work 8'.

Figure 2:
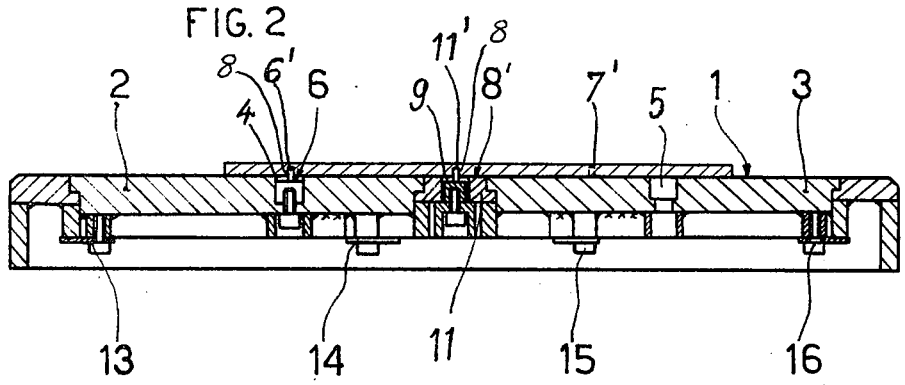
FIG. 2 is a transverse vertical sectional view taken on the line II—II of FIG. 1.

As may best be seen in FIG. 2, each disc 2,3 on its under surface is secured to a pair of spaced-apart latching elements 13,14 and 15,16, respectively, whereby the said discs may be locked into selected position after appropriate angular movement within the directions indicated by the arrows F. Said latching elements may be of any conventional character such as set screws tightenable against flanges or shoulders fixed to the underside of table 1. Similarly pin-carrying slide blocks 6,7,11,12 are rendered rigid in predetermined position within the related grooves 4,5,9,10, respectively, as by any suitable expedient, such as set screws and the like. Said grooves 4,5,9,10 may be of like extent and dimensions so that blocks 6,7,11,12 may be interchanged as well as the associated pins being interchangeable as the same are secured to the related blocks as by any currently available securing medium, such as screws and the like.

It is to be understood that although a pair of rotatable discs have been disclosed, together with table grooves, any desired number of such discs and grooves may be presented and in any option relationship without departing from the spirit of the present invention. Thus, the foregoing merely sets forth one of a possible multitude of embodiments of the present invention. Furthermore, the auxiliary character of the grooves 9,10 must be noted.

Having described my invention, what I claim and desire to obtain by Letters Patent is:

1. A printing table for use with work having positioning openings in the under portion thereof comprising a flat table-forming body, means provided on said table body for stabilizing said work against accidental shifting during the printing process comprising said body having at least one aperture therein, a complementarily formed disc disposed in said at least one aperture for rotation about an axis perpendicular to the plane of said table-forming body, said disc having a top surface coplanar with said body, said disc having an upwardly opening groove, a carriage slideably disposed in said groove for adjustable movement reciprocally longitudinally thereof, a reference pin carried on said carriage and projecting upwardly of the plane of the top surface of said disc and said body for engagement within at least one of said openings in said printing work, and means for locking said carrigage in selected adjusted position within said groove.

2. A printing table as defined in claim 1 and having a plurality of discs provided on said body in juxtaposed relationship, each of said discs having an upwardly opening groove, a carriage slideably disposed in said groove and a reference pin carried on said carriage with means for locking the carriage of each disc in its particular selected adjusted position within the related groove.

3. A printing table as defined in claim 1 and further having the groove in said disc extending radially of the related disc and having a length slightly greater than the radius of such associated disc.

4. A printing table as defined in claim 1 and further having means defining a non-shiftable fixed path on said body spaced from said disc, and at least one reference pin being mounted in said means for adjustable positioning therein.

5. A printing table as defined in claim 4 wherein said means defining a non-shiftable fixed path comprises at least one elongated groove formed in said body for coordination with the pin-carrying positionable groove of said at least one disc for accomodating particular arrangements of said openings.

6. A printing table for use with printing work having positioning openings in the undersurface thereof comprising a flat table-forming body, means provided on said body for stabilizing said work against accidental shifting during the printing process comprising said body having a plurality of spaced apart apertures, a complementary disc disposed in each aperture, means for rotatably mounting each of said discs about an axis perpendicular to the plane of said body, each of said discs having upper surfaces coplanar with the table-forming body, each disc having an upwardly opening groove, a carriage slideably disposed in said groove for adjustable movement reciprocally longitudinally thereof, a reference pin carried on each carriage and projecting upwardly of the plane of the related disc for engagement with a respective opening of the printing work, means for locking each carriage independently of the other in selected adjusted position within said groove.

7. A printing table as defined in claim 6 wherein the groove in each disc extends radially of the related disc and has a length greater than the radius of the associated disc.

8. A printing table as defined in claim 6 and further comprising by said table having at least one groove fixed therein in spaced relationship to said discs whereby said last mentioned groove is immovable in relation to the body, a carriage slideably provided within said fixed groove, a reference pin carried upon said last mentioned carriage for coordinating with the reference pins carried upon the carriages within the grooves of said discs thereby providing a range of adjustability for accommodating a particular pattern of said openings in the printing work.

* * * * *